United States Patent
Park et al.

(10) Patent No.: US 10,923,654 B2
(45) Date of Patent: Feb. 16, 2021

(54) VARIABLE RESISTANCE MEMORY DEVICE

(71) Applicant: SAMSUNG ELECTRONICS CO., LTD., Suwon-si (KR)

(72) Inventors: Ilmok Park, Seoul (KR); Kyusul Park, Suwon-si (KR); Seulji Song, Suwon-si (KR); Kwang-Woo Lee, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/426,216

(22) Filed: May 30, 2019

(65) Prior Publication Data

US 2020/0075854 A1 Mar. 5, 2020

(30) Foreign Application Priority Data

Aug. 28, 2018 (KR) .................. 10-2018-0101455

(51) Int. Cl.
*H01L 27/24* (2006.01)
*H01L 45/00* (2006.01)
*G11C 13/00* (2006.01)

(52) U.S. Cl.
CPC ...... *H01L 45/1253* (2013.01); *G11C 13/0004* (2013.01); *H01L 27/24* (2013.01); *H01L 45/06* (2013.01); *H01L 45/145* (2013.01)

(58) Field of Classification Search
CPC ..... H01L 45/1253; H01L 27/24; H01L 45/06; H01L 45/12; H01L 45/125; H01L 45/145; G11C 13/0004

USPC .............................................. 257/4
See application file for complete search history.

(56) References Cited

U.S. PATENT DOCUMENTS

| | | | |
|---|---|---|---|
| 8,426,967 B2 | 4/2013 | Joseph et al. | |
| 8,536,013 B2 | 9/2013 | Kim et al. | |
| 9,076,962 B2 | 7/2015 | Hong et al. | |
| 9,118,003 B2 | 8/2015 | Park et al. | |
| 9,252,362 B2 | 2/2016 | Pio | |
| 9,406,881 B1 | 8/2016 | Tortorelli et al. | |
| 2012/0007033 A1 | 1/2012 | Kim | |
| 2012/0040508 A1* | 2/2012 | Oh ............. | H01L 27/2463 438/382 |

(Continued)

FOREIGN PATENT DOCUMENTS

KR 10-1071191 B1 10/2011
KR 10-2017-0099173 A 8/2017

(Continued)

*Primary Examiner* — Fazli Erdem
(74) *Attorney, Agent, or Firm* — Lee IP Law, P.C.

(57) ABSTRACT

A variable resistance memory device includes a word line extending in a first direction, a bit line on the word line and extending in a second direction intersecting the first direction, a switching pattern between the bit line and the word line, a phase change pattern between the switching pattern and the word line, and a bottom electrode between the phase change pattern and the word line, wherein the phase change pattern has a bottom area greater than a top area of the bottom electrode, a thickness of the phase change pattern being greater than a thickness of the bottom electrode, and wherein the bottom and top areas are defined in the first and second directions, and the thicknesses are defined in a third direction intersecting the first and second directions.

16 Claims, 27 Drawing Sheets

(56) References Cited

U.S. PATENT DOCUMENTS

| | | |
|---|---|---|
| 2013/0058158 A1 | 3/2013 | Pellizer et al. |
| 2014/0124726 A1* | 5/2014 | Oh .................. H01L 27/2409 257/4 |
| 2018/0047899 A1 | 2/2018 | Horii et al. |
| 2018/0130527 A1 | 5/2018 | Lee |

FOREIGN PATENT DOCUMENTS

| | | |
|---|---|---|
| KR | 10-2018-0017850 A | 2/2018 |
| KR | 10-2018-0051286 A | 5/2018 |

* cited by examiner

VARIABLE RESISTANCE MEMORY DEVICE

CROSS-REFERENCE TO RELATED APPLICATION

Korean Patent Application No. 10-2018-0101455, filed on Aug. 28, 2018, in the Korean Intellectual Property Office, and entitled: "Variable Resistance Memory Device," is incorporated by reference herein in its entirety.

BACKGROUND

1. Field

The present disclosure relates to a variable resistance memory device, and more particularly, to a variable resistance memory device with improved reliability.

2. Description of the Related Art

According to demand for high capacity and low power consumption of a memory device, research is being conducted on next-generation memory devices that are non-volatile and do not require a refresh operation. For example, the next-generation memory devices include PRAM (Phase change Random Access Memory), NFGM (Nano Floating Gate Memory), PoRAM (Polymer RAM), MRAM (Magnetic RAM), FeRAM (Ferroelectric RAM), and RRAM (Resistive RAM).

SUMMARY

According to some example embodiments, a variable resistance memory device may include a word line extending in a first direction, a bit line on the word line and extending in a second direction intersecting the first direction, a switching pattern between the bit line and the word line, a phase change pattern between the switching pattern and the word line, and a bottom electrode between the phase change pattern and the word line. The phase change pattern may have an area greater than an area of the bottom electrode, and a thickness greater than a thickness of the bottom electrode, the area defined in the first and second directions, the thickness defined in a third direction intersecting the first and second directions.

According to some example embodiments, a variable resistance memory device may include a word line extending in a first direction on a substrate, a bottom electrode on the word line, a plurality of dielectric patterns on the word line and on opposite sides of the bottom electrode, the plurality of dielectric patterns being arranged in the first direction, a phase change pattern on the bottom electrode between the dielectric patterns, a middle electrode on the phase change pattern, a switching pattern on the middle electrode, a top electrode on the switching pattern, and a bit line on the top electrode and extending in a second direction intersecting the first direction. The phase change pattern may be wider in the first and second directions than the bottom electrode. The phase change pattern may be thinner in a third direction than the dielectric patterns. The phase change pattern may be thicker in the third direction than the bottom electrode. The third direction may intersect the first and second directions.

BRIEF DESCRIPTION OF THE DRAWINGS

Features will become apparent to those of skill in the art by describing in detail exemplary embodiments with reference to the attached drawings, in which:

FIGS. 7A to 17A illustrate cross-sectional views taken along line I-I' of FIG. 1, showing stages in a method of fabricating a variable resistance memory device according to some example embodiments.

FIGS. 7B to 17B illustrate cross-sectional views taken along line II-II' of FIG. 1, showing stages in a method of fabricating a variable resistance memory device according to some example embodiments.

DETAILED DESCRIPTION

Figure 1:
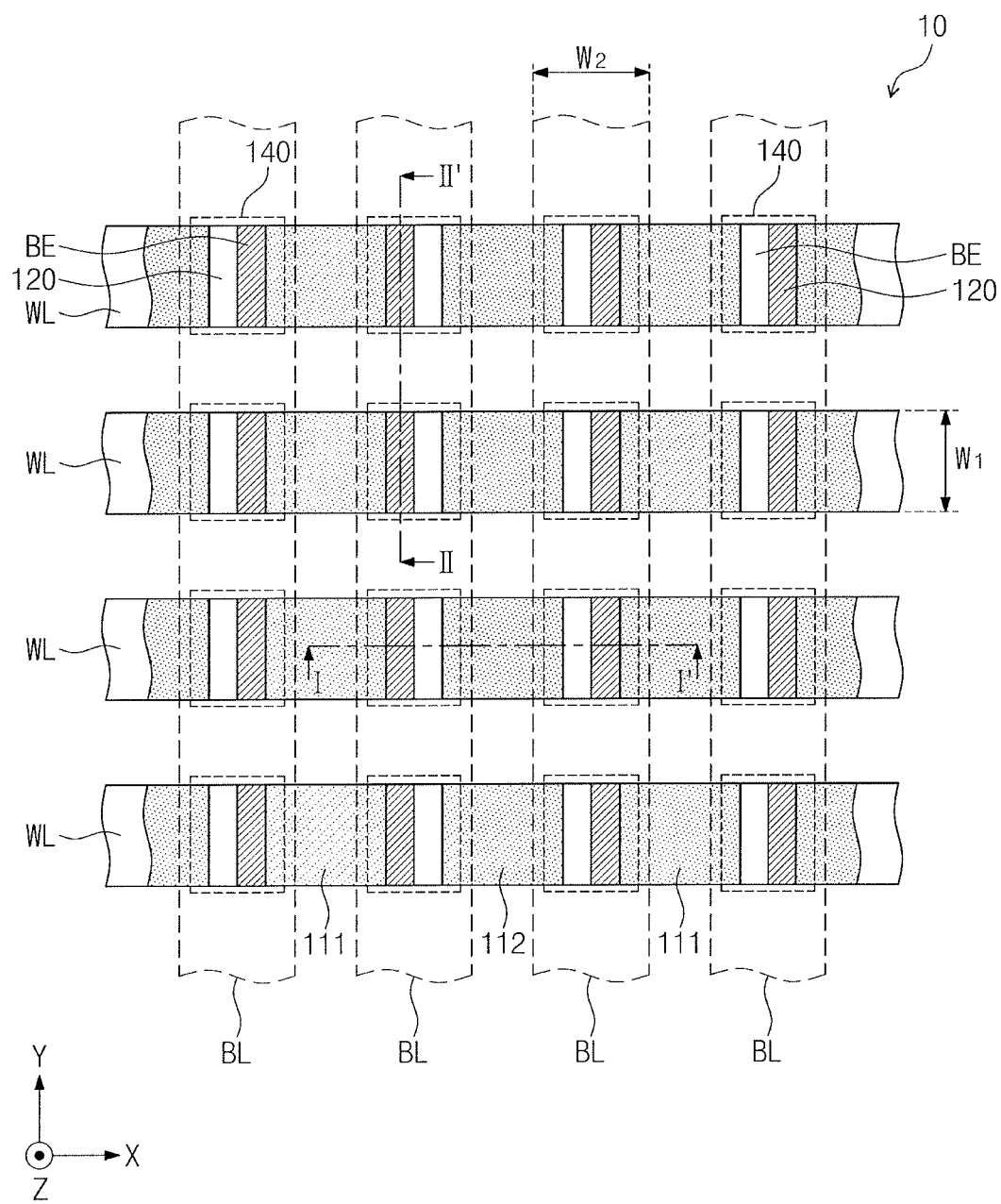
FIG. 1 illustrates a plan view of a variable resistance memory device according to some example embodiments.
Figure 2A:
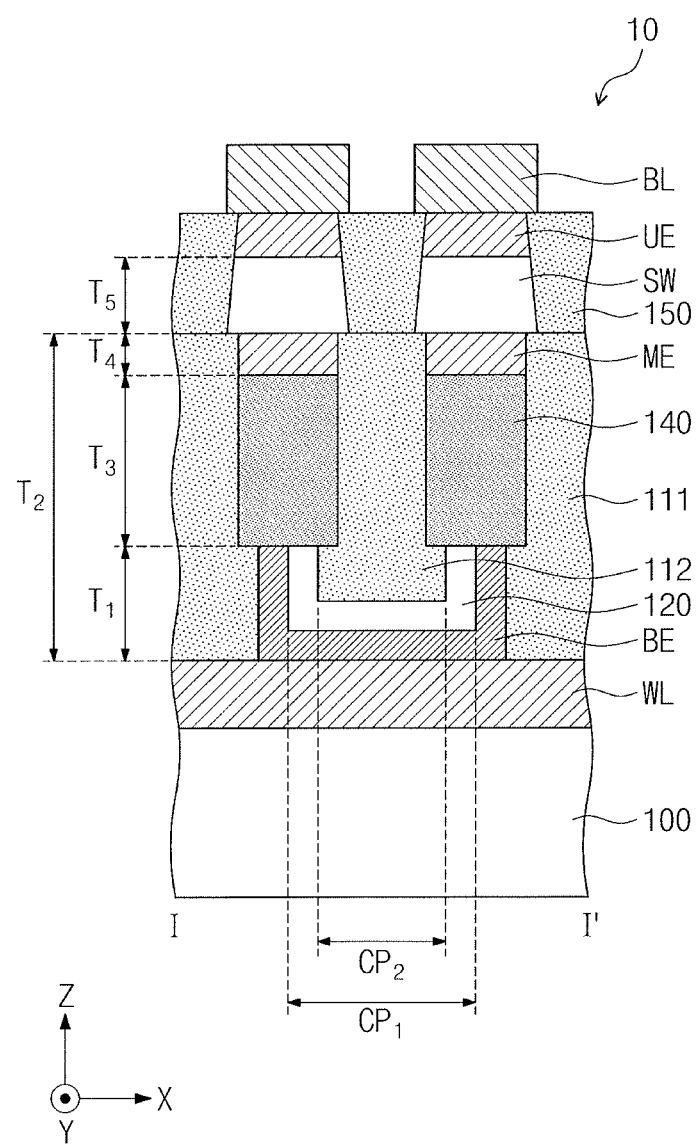
FIG. 2A illustrates a cross-sectional view taken along line I-I' of FIG. 1.
Figure 2B:
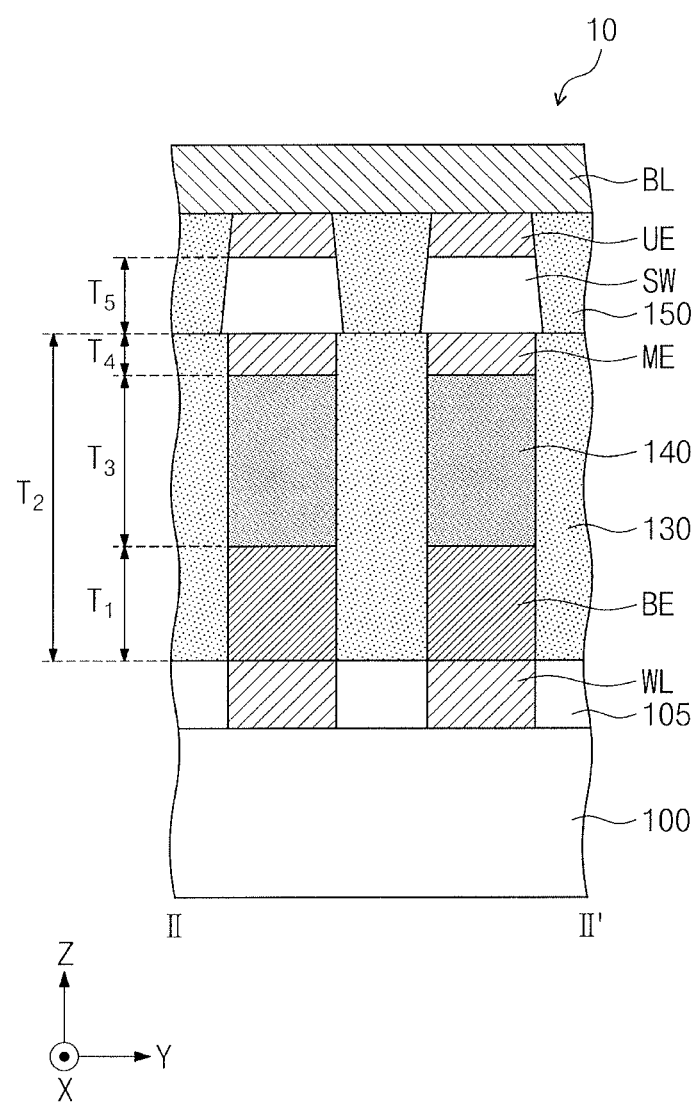
FIG. 2B illustrates a cross-sectional view taken along line II-II' of FIG. 1.

FIG. 1 shows a variable resistance memory device 10 according to some example embodiments. FIG. 2A shows a cross-sectional view taken along line I-I' of FIG. 1. FIG. 2B shows a cross-sectional view taken along line II-IF of FIG. 1.

Referring to FIGS. 1, 2A, and 2B, the variable resistance memory device 10 according to the present disclosure may be a cross-point PRAM (phase change random access memory) device. In certain embodiment, the variable resistance memory device 10 may include a substrate 100, a word line WL, a first interlayer dielectric layer 105, a bottom electrode BE, a spacer pattern 120, first and second dielectric patterns 111 and 112, a second interlayer dielectric layer 130, a phase change pattern 140, a middle electrode ME, a switching pattern SW, a top electrode UE, a third interlayer dielectric layer 150, and a bit line BL.

The substrate 100 may include a single crystalline semiconductor material. For example, the substrate 100 may be a silicon substrate, a silicon-on-insulator (SOI) substrate, a germanium substrate, a germanium-on-insulator (GOI) substrate, and/or a silicon-germanium substrate.

The word line WL may be disposed on the substrate 100. A plurality of the word lines WL may extend in parallel along a first direction X. The word line WL may have a first width $W_1$, e.g., of about 20 nm, in a second direction Y perpendicular to the first direction X, and a thickness in a third direction Z, e.g., equal to or less than about 10 nm. The word line WL may include a conductive material. For example, the word line WL may include one or more of a metallic material, e.g., copper or aluminum, and a conductive metal nitride material, e.g., TiN or WN.

The first interlayer dielectric layer 105 may be disposed on the substrate 100 between the plurality of word lines WL (FIG. 2B). The first interlayer dielectric layer 105 may have the same thickness as that of the word line WL along the third direction Z. For example, the first interlayer dielectric layer 105 may have a thickness equal to or less than about 10 nm. The first interlayer dielectric layer 105 may include, e.g., silicon nitride or silicon oxide.

The bottom electrode BE may be disposed, e.g., directly, on the word line WL. A plurality of the bottom electrodes BE may be disposed spaced apart from each other in the first and second directions X and Y. A width in the second direction Y of the bottom electrode BE may be the same as the first width $W_1$, and a width in the first direction X of the bottom electrode BE may be smaller than a second width $W_2$ of the bit line BL (FIG. 2A). For example, the bottom electrode BE may have a width of about 20 nm in the second direction Y and a width of about 10 nm in the first direction X. The bottom electrode BE may be thicker than the word line WL in the third direction Z. For example, the bottom electrode BE may have a first thickness $T_1$ of about 20 nm to about 60 nm in the third direction Z (FIG. 2A). When the first thickness $T_1$ is equal to or less than about 13 nm, the bottom electrode BE may have heat loss. A first connection part $CP_1$ may be provided to physically connect a pair of the bottom electrodes BE adjacent to each other in the first direction X. The first connection part $CP_1$ may connect lower portions of the pair of the bottom electrodes BE to each other. The first connection part $CP_1$ may have a thickness less than the first thickness $T_1$. When viewed in cross-section, as illustrated in FIG. 2A, the pair of the bottom electrodes BE and the first connection part $CP_1$ physically connected thereto may have a U shape. For another example, although not shown, the pair of the bottom electrodes BE adjacent to each other may be separated in the first direction X. The bottom electrode BE may be a heater electrode to heat the phase change pattern 140. The bottom electrode BE may include one or more of, e.g., W, Ti, Al, Cu, C, CN, TiN, TiAlN, TiSiN, TiCN, WN, CoSiN, WSiN, TaN, TaCN, TaSiN, and TiO.

The spacer pattern 120 may be disposed adjacent to the bottom electrode BE. The spacer pattern 120 may be disposed on the first connection part $CP_1$. Alternatively, the spacer pattern 120 may be disposed in the bottom electrode BE. The spacer pattern 120 may have a top surface at the same level as that of a top surface of the bottom electrode BE. The spacer pattern 120 may have a thickness less than the first thickness $T_1$. A second connection part $CP_2$ may be provided to physically connect a pair of the spacer patterns 120 adjacent to each other in the first direction X. The spacer pattern 120 may have the same shape as that of the bottom electrode BE. When viewed in cross-section, the pair of the spacer patterns 120 and the second connection part $CP_2$ physically connected thereto may have a U shape. For another example, although not shown, the pair of the spacer patterns 120 adjacent to each other may be separated in the first direction X. The spacer pattern 120 may include, e.g., silicon oxide or polysilicon.

The first and second dielectric patterns 111 and 112 may be disposed on the word line WL. The first dielectric pattern 111 may be disposed outside the pair of the bottom electrodes BE, e.g., outside the pair of connected bottom electrodes BE (FIG. 2A). The second dielectric pattern 112 may be disposed between the pair of the spacer patterns 120, e.g., between the pair of connected bottom electrodes BE (FIG. 2A). For example, the first dielectric pattern 111 may be disposed outside the first connection part $CP_1$, e.g., directly on the word lines WL, and the second dielectric pattern 112 may be disposed on the second connection part $CP_2$, e.g., the second connection part $CP_2$ may be between the first connection part $CP_1$ and the second dielectric pattern 112. The first dielectric pattern 111 may have a second thickness $T_2$ equal to or less than about 100 nm. The first and second dielectric patterns 111 and 112 may include, e.g., silicon nitride.

The second interlayer dielectric layer 130 may be disposed on the first interlayer dielectric layer 105 between the plurality of the word lines WL. The second interlayer dielectric layer 130 may have a top surface at the same level as that of top surfaces of the first and second dielectric patterns 111 and 112. The second interlayer dielectric layer 130 may have the same thickness as the second thickness $T_2$. For example, the second interlayer dielectric layer 130 may have a thickness equal to or less than about 100 nm. The second interlayer dielectric layer 130 may include, e.g., silicon nitride or silicon oxide.

The phase change pattern 140 may be disposed on the bottom electrode BE and the spacer pattern 120. The phase change pattern 140 may have a greater area in the first and second directions X and Y than that of the bottom electrode BE. For example, as illustrated in FIG. 2A, the phase change pattern 140 may extend beyond, e.g., overhang, the bottom electrode BE in the first direction X, so the bottom area of the phase change pattern 140, e.g., an area of a surface of the phase change pattern 140 facing the bottom electrode BE, may be greater that the top area of the bottom electrode BE, e.g., an area of a surface of the bottom electrode BE facing the phase change pattern 140. A plurality of the phase change patterns 140 may be disposed spaced apart from each other in the first and second directions X and Y, e.g., in a matrix pattern (i.e., dashed quadrangles in FIG. 1). For example, referring to FIGS. 1-2B, two phase change patterns 140 may be adjacent to each other in the first direction X on the same word line WL, while being on connected bottom electrodes BE (FIG. 2A), and two phase change patterns 140 may be adjacent to each other in the second direction Y, while being on different word lines WL and on separated bottom electrodes BE (FIG. 2B). The phase change pattern 140 may be thicker in the third direction Z than the bottom electrode BE. For example, the phase change pattern 140 may have a third thickness $T_3$ of about 40 nm to about 90 nm. When the third thickness $T_3$ is equal to or less than about 10 nm, the phase change pattern 140 may have void defects.

The phase change pattern 140 may include at least one of materials capable of storing data. The phase change pattern 140 may include a material whose phase is reversibly changed between crystalline and amorphous states based on temperature. For example, the phase change pattern 140 may be formed of a compound in which one or more of Te and Se as chalcogen elements are combined with one or more of Ge, Sb, Bi, Pb, Sn, Ag, As, S, Si, In, Ti, Ga, P, O, and C. The phase change patterns 140 may include, e.g., one or more of GeSbTe, GeTeAs, SbTeSe, GeTe, SbTe, SeTeSn, GeTeSe, SbSeBi, GeBiTe, GeTeTi, InSe, GaTeSe, and InSbTe. Alternatively, the phase change pattern 140 may include one or more of perovskite compounds and conductive metal oxides. For example, the phase change pattern 140 may include one or more of niobium oxide, titanium oxide, nickel oxide, zirconium oxide, vanadium oxide, PCMO(($Pr,Ca)MnO_3$), strontium-titanium oxide, barium-strontium-titanium oxide, strontium-zirconium oxide, barium-zirconium oxide, and barium-strontium-zirconium oxide. When the phase change pattern 140 includes transition metal oxide, the phase change pattern 140 may have a dielectric constant greater than that of a silicon oxide layer. Alternatively, the phase change pattern 140 may have either a double structure of a conductive metal oxide layer and a tunnel dielectric layer or a triple structure of a first conductive metal oxide layer, a tunnel dielectric layer, and a second conductive metal oxide layer. The tunnel dielectric layer may include aluminum oxide, hafnium oxide, or silicon oxide.

The middle electrode ME may be disposed on the phase change pattern 140. For example, the middle electrode ME may serve as a first diffusion break layer between the phase change pattern 140 and the switching pattern SW. The middle electrode ME may have the same area in the first and second directions X and Y as that of the phase change pattern 140, e.g., the middle electrode ME may completely cover and overlap the top of the phase change pattern 140. The middle electrode ME may have a top surface at the same level as that of the top surfaces of the first and second dielectric patterns 111 and 112 and that of the top surface of the second interlayer dielectric layer 130. The middle electrode ME may be thinner in the third direction Z than the phase change pattern 140 or the bottom electrode BE. The middle electrode ME may have a fourth thickness $T_4$ equal to or less than about 10 nm. The middle electrode ME may include, e.g., TiN.

The switching pattern SW may be disposed on the middle electrode ME. The switching pattern SW may be thinner than the phase change pattern 140. For example, the switching pattern SW may have a fifth thickness $T_5$ of about 10 nm to about 15 nm. The switching pattern SW may connect the bit line BL to the word line WL. When a voltage (e.g., writing and/or reading voltages) is applied between the word line WL and the bit line BL, the switching pattern SW may be converted from a dielectric state into a conductive state. A current flowing through the switching pattern SW may be transferred to the bottom electrode BE, thereby causing heat generation from the bottom electrode BE.

The switching pattern SW may be an OTS (Ovonic Threshold Switch) device exhibiting bidirectional characteristics. For example, the switching pattern SW may include a device configured to switch its phase based on a threshold switching phenomenon having a nonlinear I-V curve (e.g., S-type I-V curve). The switching pattern SW may have a threshold voltage (Vth) of about 3 V to about 4 V. When the word line WL and the bit line BL are provided therebetween with a voltage equal to or greater than the threshold voltage (Vth), the switching pattern SW may be turned on. The threshold voltage (Vth) may be changed based on an accumulative use time and/or defect of the switching pattern SW. For example, the switching pattern SW may have a threshold voltage change (ΔVth). In certain embodiment, the threshold voltage change (ΔVth) may include a voltage drift (see 14 of FIG. 3) of the threshold voltage (Vth) and/or a voltage leak (see 16 of FIG. 3) resulting from a leakage current. For example, when the switching pattern SW is used for about 1 year, with respect to the threshold voltage (Vth), the switching pattern SW may have the voltage drift 14 of about 1.7 V and the voltage leak 16 of about 2.3 V.

The switching pattern SW may have a greater phase transition temperature than that of the phase change pattern 140. For example, the switching pattern SW may have a phase transition temperature of about 350° C. to about 450° C. Therefore, when the variable resistance memory device 10 is operated, under an operating voltage, the phase change pattern 140 may be configured to reversibly change its phase between crystalline and amorphous states, while the switching pattern SW may maintain its substantially amorphous state without the phase transition. For example, the switching pattern SW may be formed of a compound in which one or more of Te and Se as chalcogen elements are combined with one or more of Ge, Sb, Bi, Al, Pb, Sn, Ag, As, S, Si, In, Ti, Ga, and P. The switching pattern SW may further include a thermal stabilization element in addition to the compound. The thermal stabilization element may be one or more of C, N, and O. For example, the switching pattern SW may include one or more of AsTe, AsSe, GeTe, SnTe, GeSe, SnTe, SnSe, ZnTe, AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, and GeAsBiSe.

The top electrode UE may be disposed on the switching pattern SW. For example, the top electrode UE may serve as a second diffusion break layer between the switching pattern SW and the bit line BL. For example, the top electrode UE may include one or more of W, Ti, Al, Cu, C, CN, TiN, TiAlN, TiSiN, TiCN, WN, CoSiN, WSiN, TaN, TaCN, TaSiN, and TiO.

The third interlayer dielectric layer 150 may be disposed on the second interlayer dielectric layer 130, the first dielectric pattern 111, and the second dielectric pattern 112. The third interlayer dielectric layer 150 may be disposed between a plurality of the switching patterns SW. The third interlayer dielectric layer 150 may also be disposed between a plurality of the top electrodes UE. The third interlayer dielectric layer 150 may include silicon nitride or silicon oxide.

The bit line BL may be disposed on the top electrode UE and the third interlayer dielectric layer 150. A plurality of the bit lines BL may extend in parallel along the second direction Y. The bit line BL may have the second width $W_2$ of about 20 nm in the first direction X. The bit line BL may include a conductive material. For example, the bit line BL may include one or more of a metallic material, e.g., copper or aluminum, and a conductive metal nitride material, e.g., TiN or WN.

The variable resistance memory device 10 may have reliability depending on a clamping voltage difference ($\Delta V_{CMP}$) of the phase change pattern 140. When the clamping voltage difference ($\Delta V_{CMP}$) is increased, the reliability may be improved.

Figure 3:
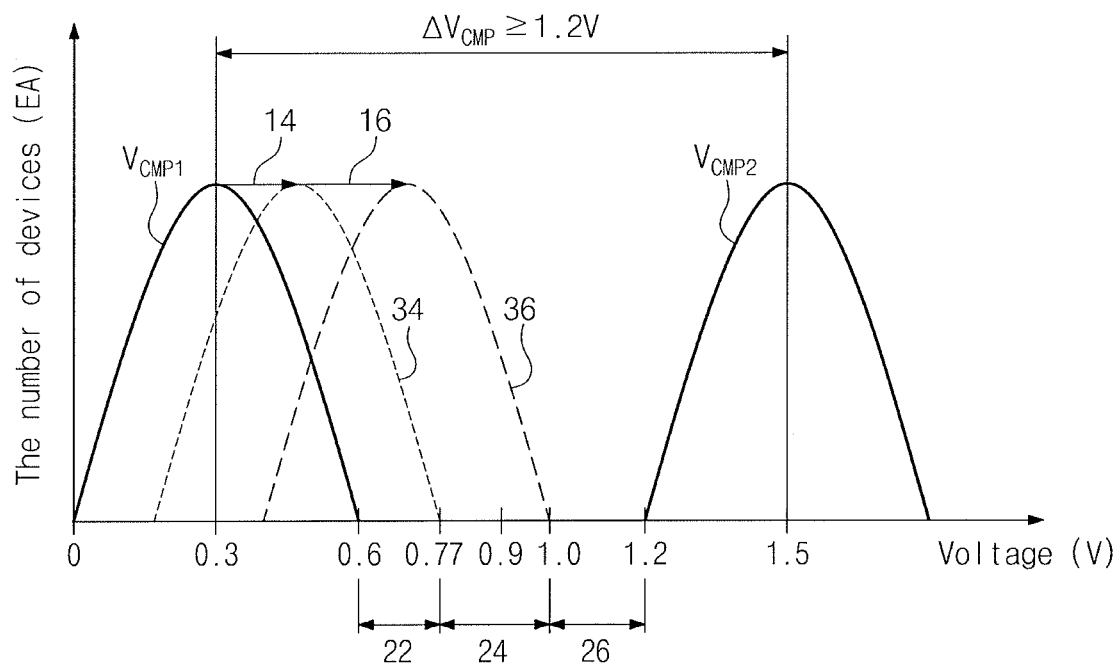
FIG. 3 illustrates a graph of a clamping voltage difference of a phase change pattern shown in FIGS. 2A and 2B.

FIG. 3 shows the clamping voltage difference ($\Delta V_{CMP}$) of the phase change pattern 140 depicted in FIGS. 2A and 2B.

Referring to FIG. 3, the phase change pattern 140 may have the clamping voltage difference ($\Delta V_{CMP}$). For example, the clamping voltage difference ($\Delta V_{CMP}$) may be equal to or greater than about 1.2 V. The clamping voltage difference ($\Delta V_{CMP}$) may be a difference between peaks of set voltage $V_{CMP1}$ and reset voltage $V_{CMP2}$ of the phase change pattern 140. The set voltage $V_{CMP1}$ may correspond to a clamping voltage drop at a first state (e.g., a crystalline state) of the phase change pattern 140. For example, the set voltage $V_{CMP1}$ may have a peak of about 0.3 V. The set voltage $V_{CMP1}$ may have a dispersion (or distribution) of about 0.6 V. The reset voltage $V_{CMP2}$ may correspond to a clamping voltage drop at a second state (e.g., an amorphous state) of the phase change pattern 140. For example, the reset voltage $V_{CMP2}$ may have a peak equal to or greater than about 1.5 V. The reset voltage $V_{CMP2}$ may have a dispersion of about 0.6 V.

The clamping voltage difference ($\Delta V_{CMP}$) may have first and second compensation values 22 and 24 of the threshold voltage change (ΔVth) of the switching pattern SW, and also have a sensing margin 26 of the phase change pattern 140. The first and second compensation values 22 and 24 may compensate the threshold voltage change (ΔVth) of the switching pattern SW, and thus the variable resistance memory device 10 may improve in reliability. The first compensation value 22 may compensate the threshold voltage change (ΔVth) caused by the voltage drift 14 within a warranty period (e.g., 1 year) of the switching pattern SW.

The first compensation value 22 may be defined by a difference between a maximum value of a set voltage 34 drifted by the voltage drift 14 and a maximum value of the set voltage $V_{CMP1}$. For example, the first compensation value 22 may be about 0.17 V. The second compensation value 24 may compensate the threshold voltage change (ΔVth) caused by the voltage leak 16 of the switching pattern SW. The second compensation value 24 may be defined by a difference between a maximum value of a set voltage 36 shifted by the voltage leak 16 and the maximum value of the drifted set voltage 34. For example, the second compensation value 24 may be about 0.23 V. The sensing margin 26 may be a minimum voltage difference to differentiate the set voltage $V_{CMP1}$ from the reset voltage $V_{CMP2}$ in a sensing circuit. The sensing margin 26 may be defined by a difference between a minimum value of the reset voltage $V_{CMP2}$ and the maximum value of the shifted set voltage 36. For example, the sensing margin 26 may be about 0.2 V.

Because the phase change pattern 140 has the clamping voltage difference ($\Delta V_{CMP}$) of the first and second compensation values 22 and 24 to remove the threshold voltage change (ΔVth) of the switching pattern SW, the switching pattern SW may improve in reliability. In conclusion, the phase change pattern 140 having the clamping voltage difference ($\Delta V_{CMP}$) equal to or greater than about 1.2 V may increase reliability of the variable resistance memory device 10.

Figure 4:
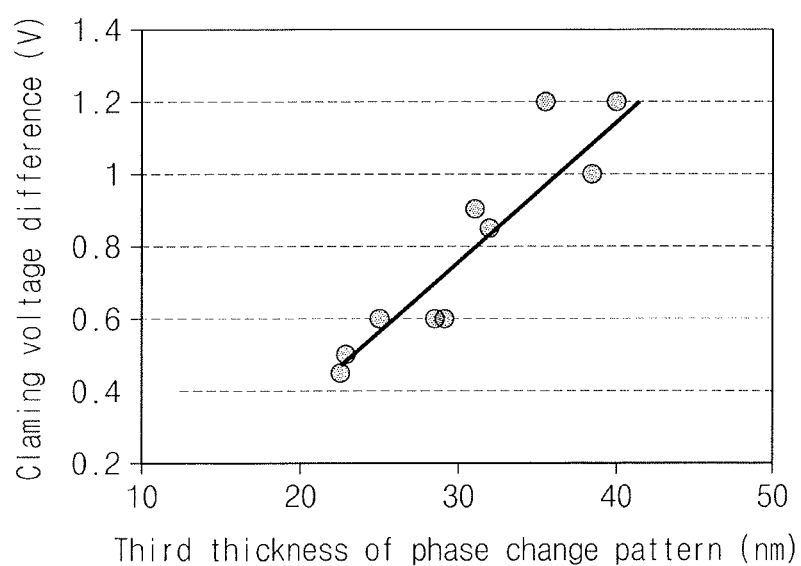
FIG. 4 illustrates a graph of a clamping voltage difference depending on a third thickness of a phase change pattern shown in FIGS. 2A and 2B.

FIG. 4 shows the clamping voltage difference ($\Delta V_{CMP}$) depending on the third thickness $T_3$ of the phase change pattern 140 depicted in FIG. 2.

Referring to FIGS. 3 and 4, the clamping voltage difference ($\Delta V_{CMP}$) may be proportional to the third thickness $T_3$ of the phase change pattern 140.

When the third thickness $T_3$ of the phase change pattern 140 is equal to or less than about 32 nm, the clamping voltage difference ($\Delta V_{CMP}$) may be less than about 1 V. When the clamping voltage difference ($\Delta V_{CMP}$) is less than about 1 V, the clamping voltage difference ($\Delta V_{CMP}$) may have neither the first compensation value 22 nor the second compensation value 24, with the result that the variable resistance memory device 10 may decrease in reliability.

When the third thickness $T_3$ of the phase change pattern 140 is equal to or greater than about 40 nm, the clamping voltage difference ($\Delta V_{CMP}$) may be equal to or greater than about 1.2 V. When the clamping voltage difference ($\Delta V_{CMP}$) is equal to or greater than about 1.2 V, the clamping voltage difference ($\Delta V_{CMP}$) may have the first and second compensation values 22 and 24, with the result that the variable resistance memory device 10 may increase in reliability.

Referring back to FIGS. 2A and 2B, the third thickness $T_3$ of phase change pattern 140 may be less than the second thickness $T_2$ of the first dielectric pattern 111 and of the second interlayer dielectric layer 130, and may be greater than the first thickness $T_1$ of the bottom electrode BE. When the middle electrode ME is absent, the second thickness $T_2$ may be a maximum limit of the third thickness $T_3$. Within the maximum limit, the greater ratio of the third thickness $T_3$ to the first thickness $T_1$, the better reliability of the variable resistance memory device 10.

Figure 5:
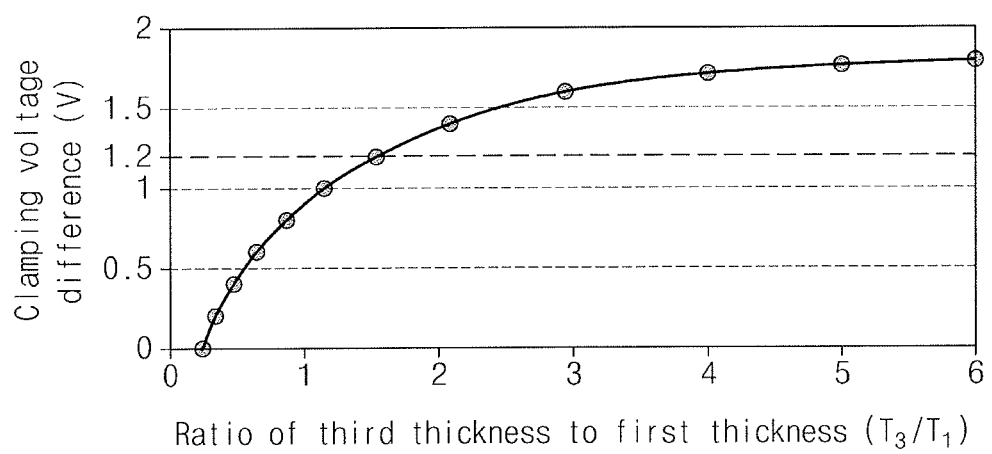
FIG. 5 illustrates a graph of a clamping voltage difference depending on a ratio of a third thickness of a phase change pattern to a first thickness of a bottom electrode shown in FIGS. 2A and 2B.

FIG. 5 shows the clamping voltage difference ($\Delta V_{CMP}$) depending on the ratio of the third thickness $T_3$ to the first thickness $T_1$ depicted in FIGS. 2A and 2B.

Referring to FIG. 5, the clamping voltage difference ($\Delta V_{CMP}$) may be proportional to the ratio of the third thickness $T_3$ of the phase change pattern 140 to the first thickness $T_1$ of the bottom electrode BE. When the clamping voltage difference ($\Delta V_{CMP}$) is equal to or greater than about 1.2 V, the thickness ratio of the phase change pattern 140 to the bottom electrode BE may be about 1.5 to about 6.0. In this sense, the phase change pattern 140 and the bottom electrode BE may have the thickness ratio of about 1.5:1 to about 6:1. When the phase change pattern 140 and the bottom electrode BE have the thickness ratio of about 1.5:1 to about 6:1, the variable resistance memory device 10 may improve in reliability.

The following will describe a method of fabricating the variable resistance memory device 10 configured discussed above.

Figure 6:
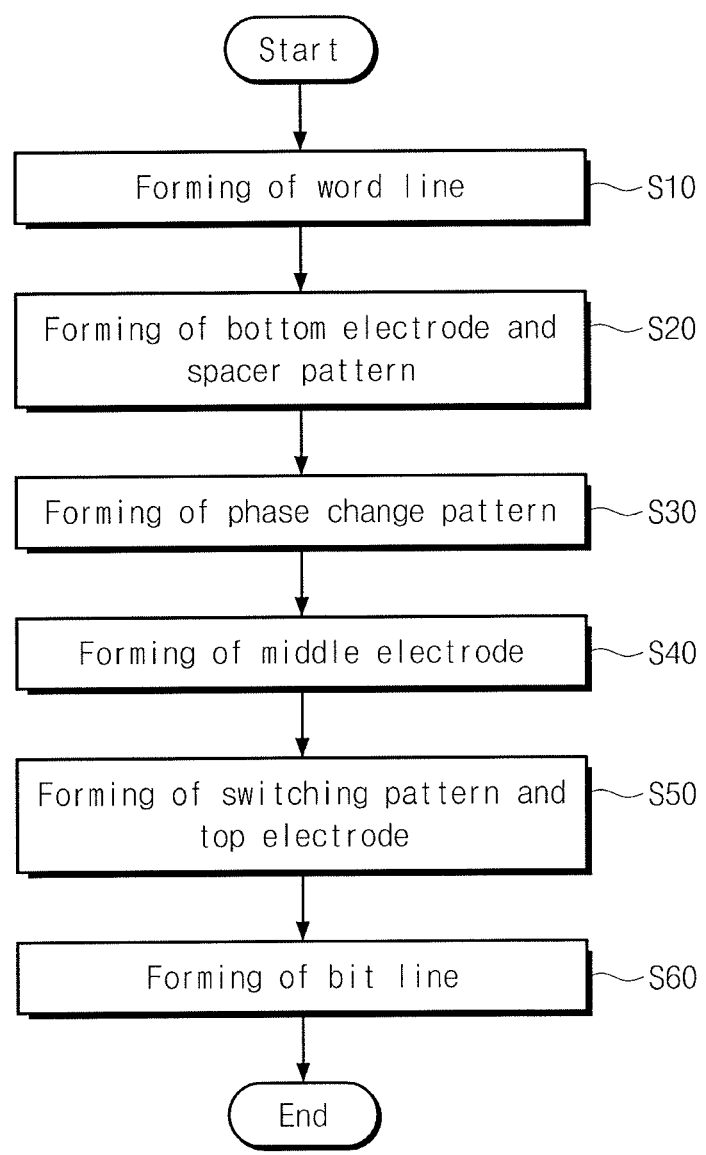
FIG. 6 illustrates a flow chart of a method of fabricating the variable resistance memory device shown in FIG. 1.

FIG. 6 shows a method of fabricating the variable resistance memory device 10 depicted in FIG. 1.

Referring to FIG. 6, the method of fabricating the variable resistance memory device 10 according to the present disclosure may include an operation S10 of forming the word line WL, an operation S20 of forming the bottom electrode BE and the spacer pattern 120, an operation S30 of forming the phase change pattern 140, an operation S40 of forming the middle electrode ME, an operation S50 of forming the switching pattern SW and the top electrode UE, and an operation S60 of forming the bit line BL.

FIGS. 7A to 17A illustrate cross-sectional views taken along line I-I' of FIG. 1, showing stages in a method of fabricating a variable resistance memory device according to some example embodiments. FIGS. 7B to 17B illustrate cross-sectional views taken along line of FIG. 1, showing stages in a method of fabricating a variable resistance memory device according to some example embodiments.

Figure 7A:
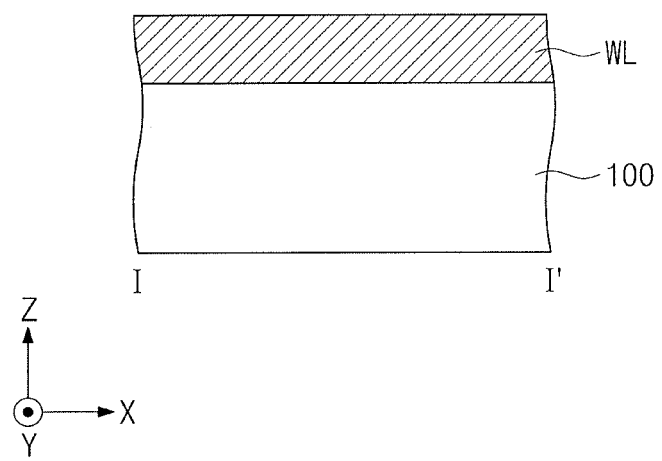
Figure 7B:
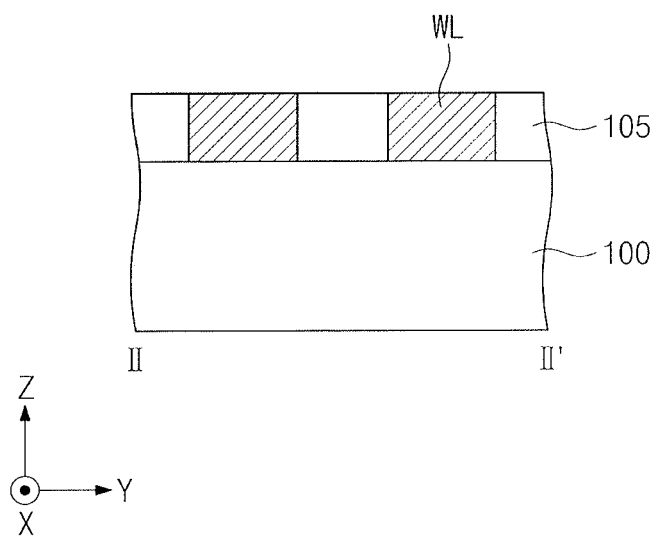

Referring to FIGS. 6, 7A, and 7B, the word line WL may be formed on the substrate 100 (S10). For example, the word line WL may be formed by a metal deposition process, a photolithography process, and an etching process. The first interlayer dielectric layer 105 may be formed between a plurality of the word lines WL. Alternatively, the word line WL may be formed by a damascene process. For example, after the first interlayer dielectric layer 105 having a trench is formed on the substrate 100, a thin-layer deposition process may be performed to form a metal layer and then a chemical mechanical polishing process may be performed on the metal layer to form the word line WL in the trench.

Referring to FIGS. 6, 8A to 12A, and 8B to 12B, the bottom electrode BE and the spacer pattern 120 may be formed on the word line WL (S20). The bottom electrode BE and the spacer pattern 120 may be formed by the following processes.

Figure 8A:
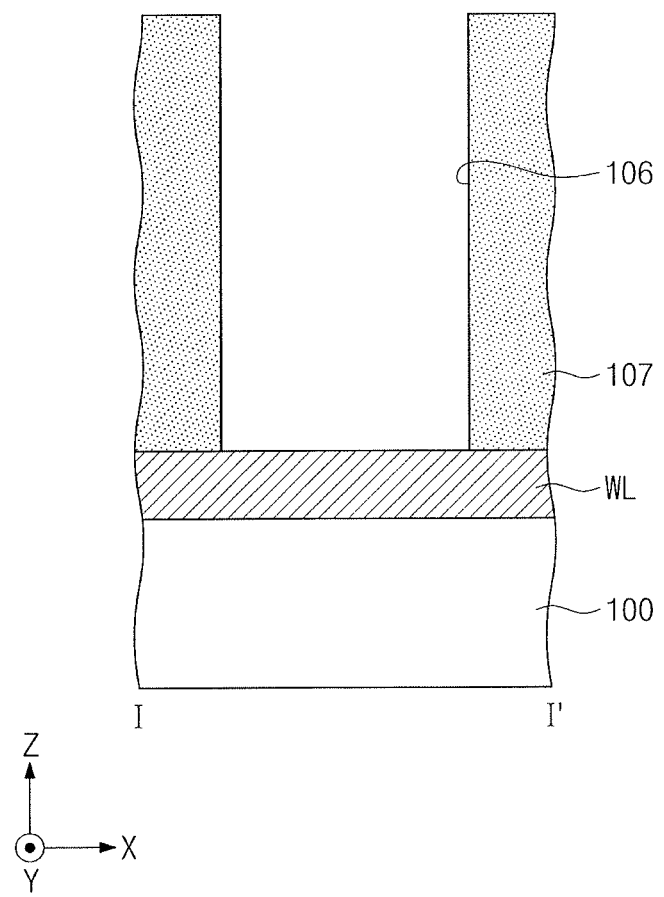
Figure 8B:
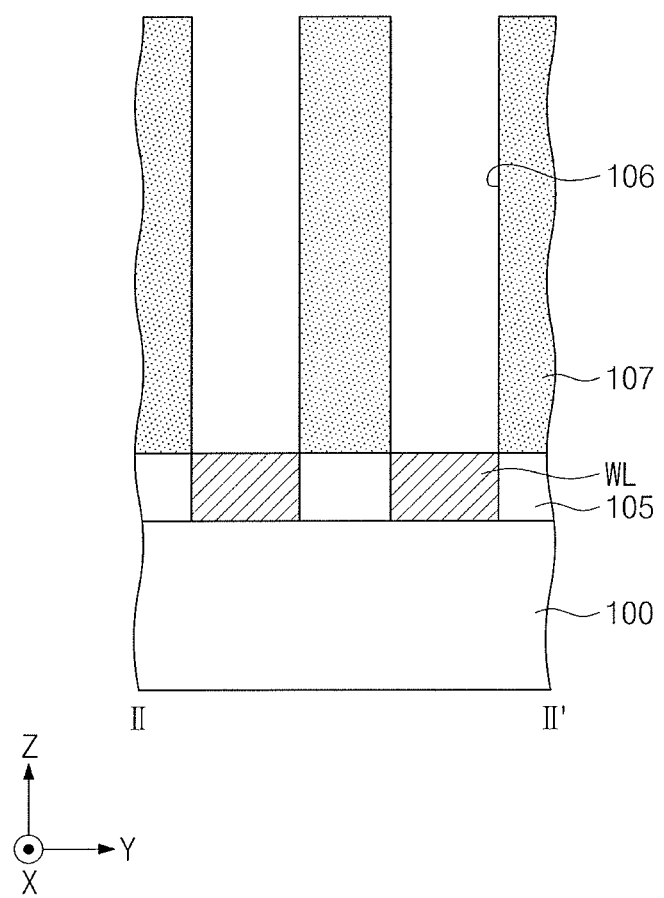

Referring to FIGS. 8A and 8B, a first dielectric layer 107 may be formed on the word line WL and the first interlayer dielectric layer 105. For example, the first dielectric layer 107 may include silicon nitride formed by a chemical vapor deposition process. The first dielectric layer 107 may be formed to have a thickness of about 200 nm. The first dielectric layer 107 may have a first trench 106 formed by a photolithography process and an etching process. The first trench 106 may partially expose the word line WL and the first interlayer dielectric layer 105. The first trench 106 may have a depth of about 200 nm and a width of about 40 nm, while extending in the second direction Y.

Figure 9A:
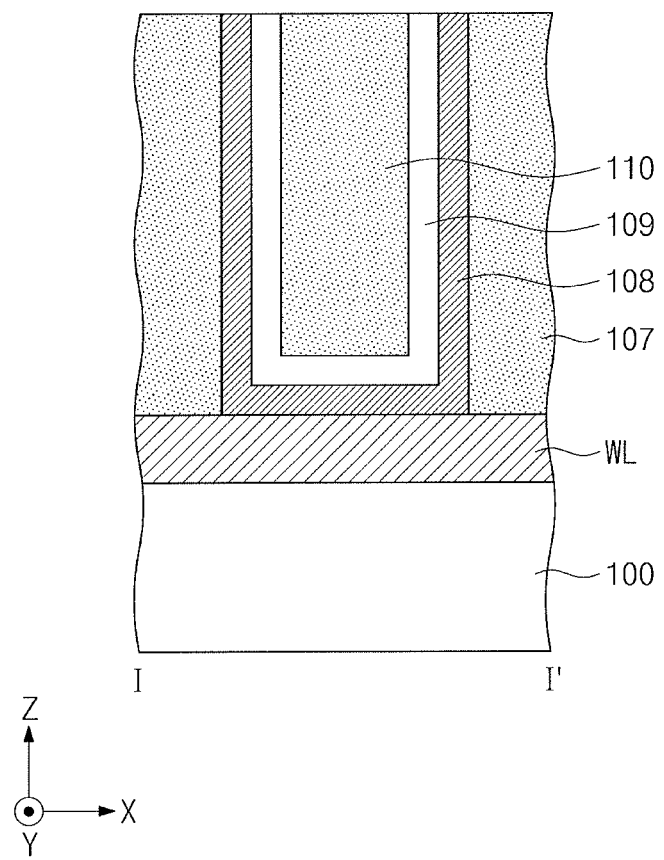
Figure 9B:
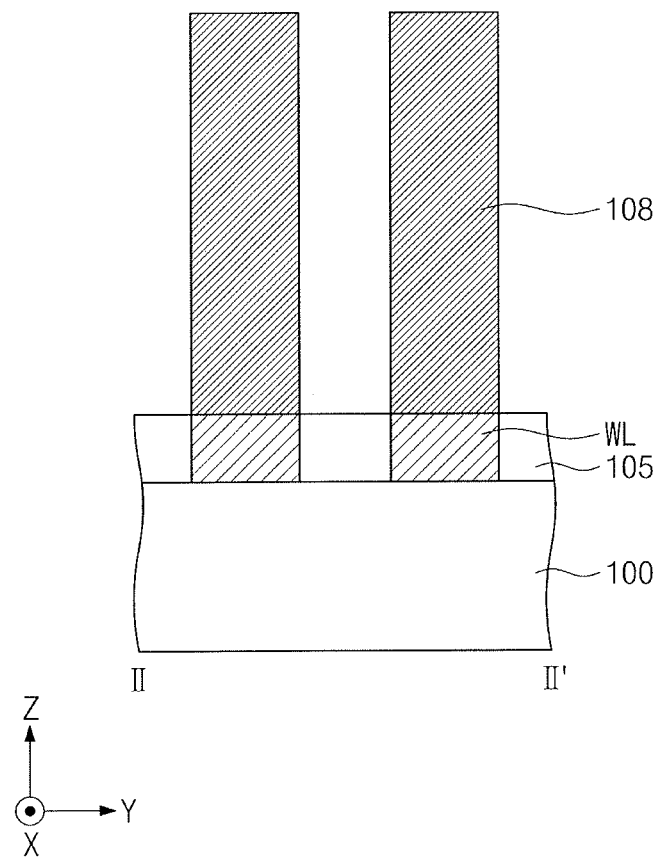

Referring to FIGS. 9A and 9B, a preliminary electrode layer 108, a preliminary spacer layer 109, and a second dielectric layer 110 may be formed on the first dielectric layer 107 and the word line WL that is exposed through the trench 106. The preliminary electrode layer 108 may include a metal layer, and the preliminary spacer layer 109 may include a dielectric layer consisting of silicon oxide or silicon nitride. The preliminary electrode layer 108 and the preliminary spacer layer 109 may be conformally formed on the word line WL and the first dielectric layer 107, and the second dielectric layer 110 may be formed on the preliminary spacer layer 109. The second dielectric layer 110 may fill the first trench 106.

A chemical mechanical polishing process may be performed to planarize the preliminary electrode layer 108, the preliminary spacer layer 109, and the second dielectric layer 110. When the preliminary electrode layer 108, the preliminary spacer layer 109, and the second dielectric layer 110 are planarized, the first dielectric layer 107 may decrease in thickness. For example, the thickness of the first dielectric layer 107 may be reduced by about 20 nm.

The preliminary electrode layer 108, the preliminary spacer layer 109, the first dielectric layer 107, and the second dielectric layer 110 may be partially removed outside the word line WL. The preliminary electrode layer 108, the preliminary spacer layer 109, the first dielectric layer 107, and the second dielectric layer 110 may each be separated in the second direction Y. The preliminary electrode layer 108, the preliminary spacer layer 109, the first dielectric layer 107, and the second dielectric layer 110 may remain on the word line WL.

Figure 10A:
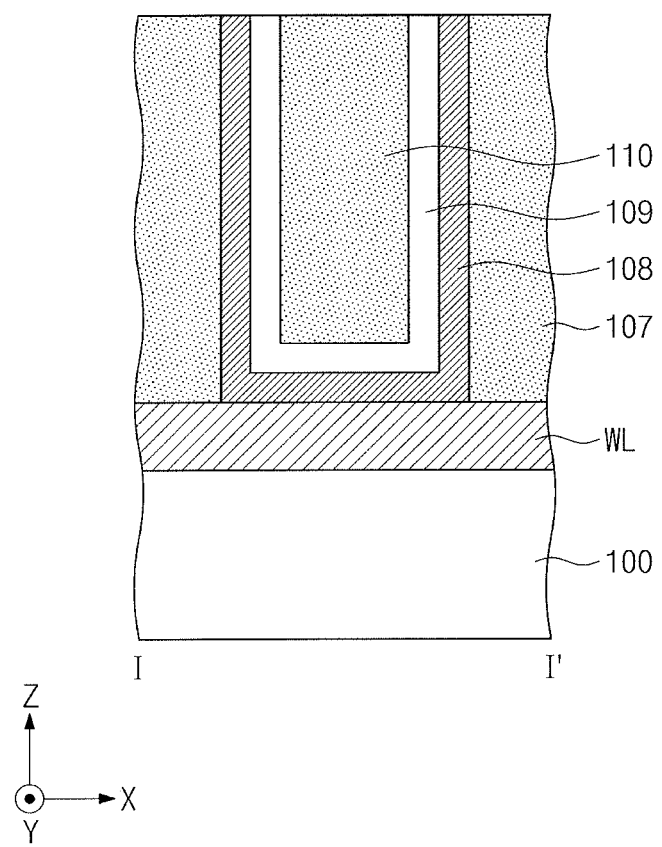
Figure 10B:
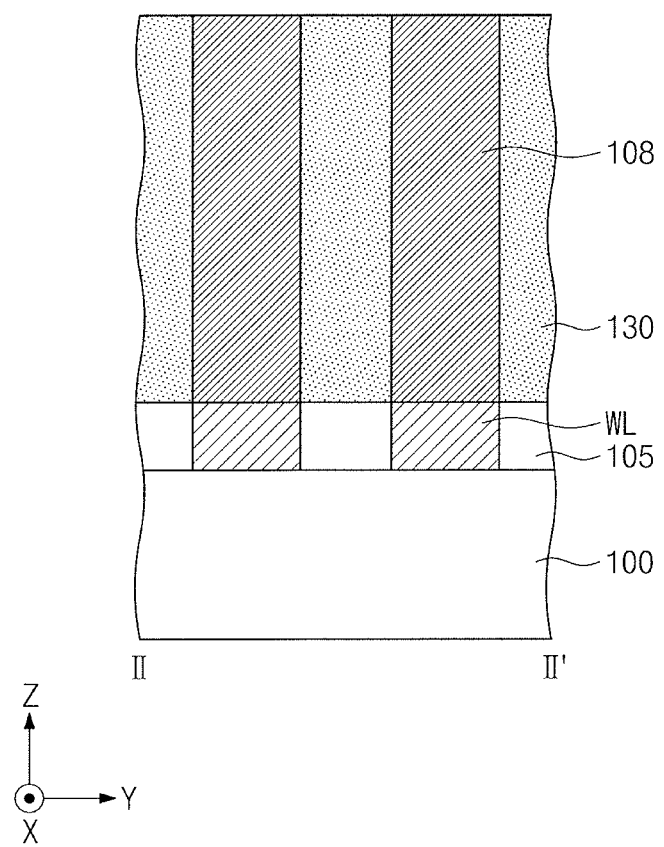

Referring to FIGS. 10A and 10B, the second interlayer dielectric layer 130 may be formed on the first interlayer dielectric layer 105. The second interlayer dielectric layer 130 may be formed by a thin-layer deposition process to form a dielectric layer and a chemical mechanical polishing process. When the second interlayer dielectric layer 130 is planarized by the chemical mechanical polishing process, the first dielectric layer 107 may decrease in thickness. For example, the thickness of the first dielectric layer 107 may be reduced by about 20 nm.

Figure 11A:
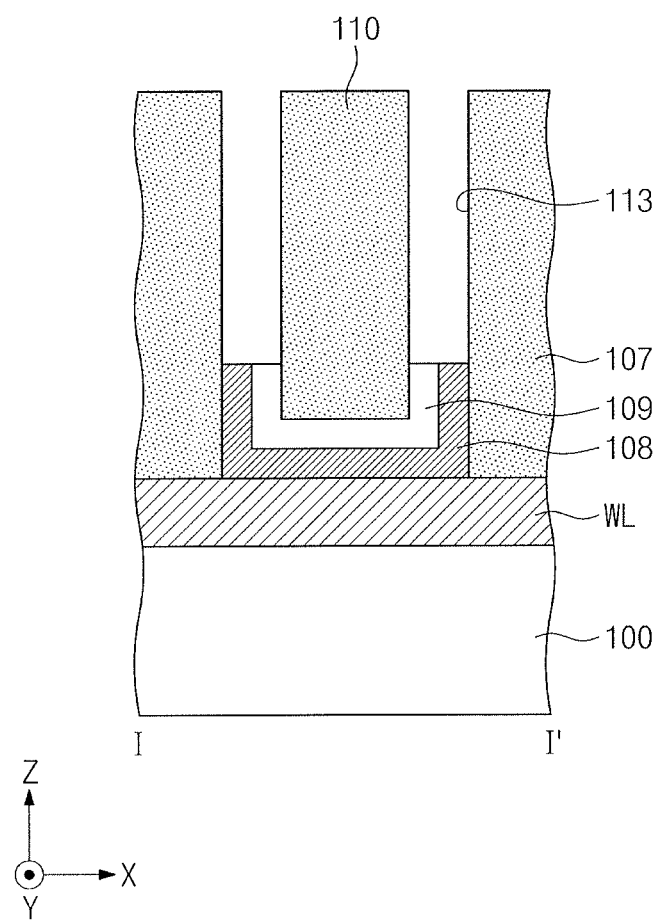
Figure 11B:
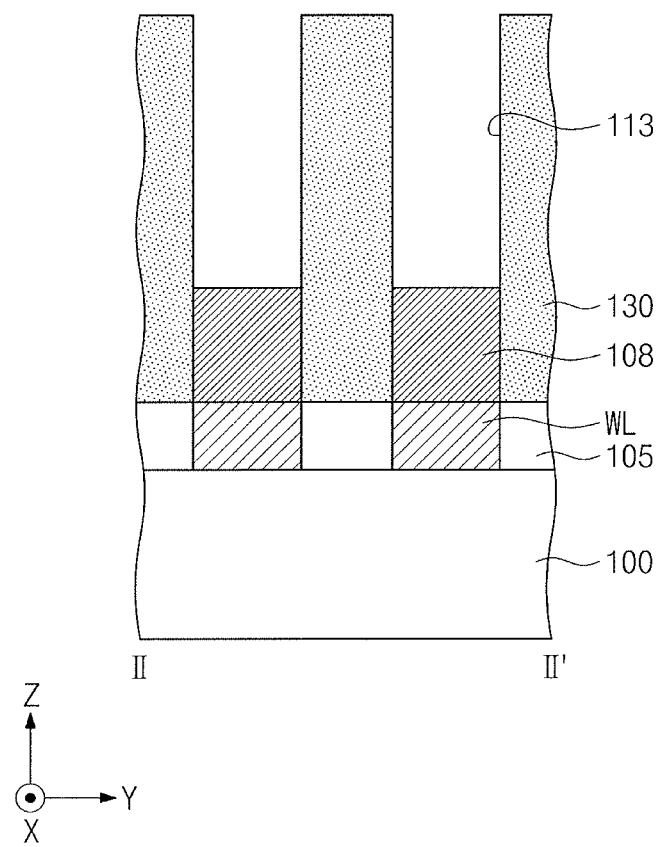

Referring to FIGS. 11A and 11B, upper portions of the preliminary electrode layer 108 and the preliminary spacer layer 109 may be etched to form a second trench 113. For example, a wet etching process may be performed to remove the upper portions of the preliminary electrode layer 108 and the preliminary spacer layer 109. The preliminary electrode layer 108 and the preliminary spacer layer 109 may be etched by an etchant having an etch selectivity with respect to the first dielectric layer 107, the second dielectric layer 110, and the second interlayer dielectric layer 130. The wet etching process may remove a portion of the first dielectric layer 107. In this case, the wet etching process may reduce the thickness of the first dielectric layer 107. For example, the thickness of the first dielectric layer 107 may be reduced by about 20 nm.

Figure 12A:
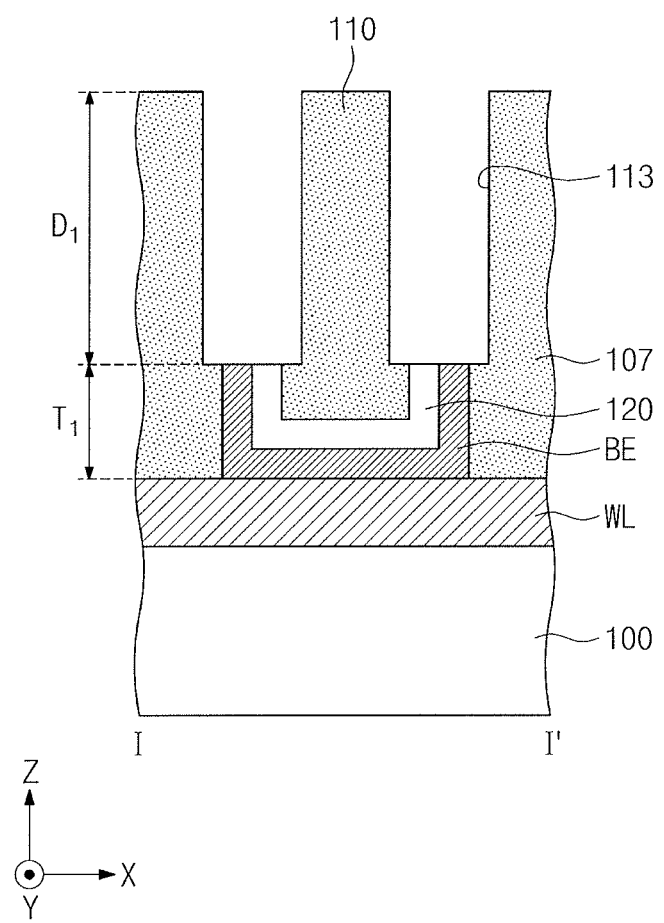
Figure 12B:
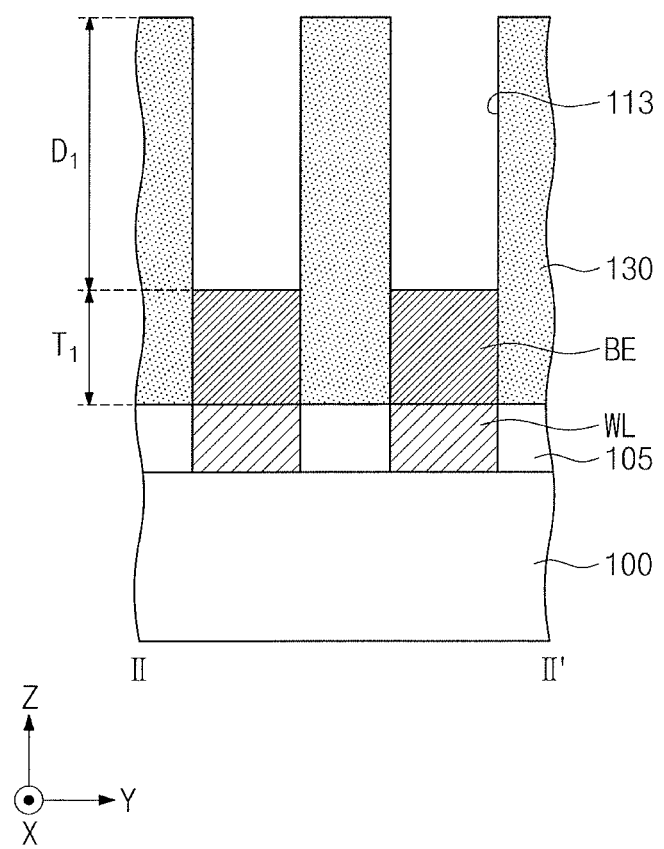

Referring to FIGS. 12A and 12B, the second trench 113 may be enlarged to form the preliminary electrode layer 108 into the bottom electrode BE and to form the preliminary spacer layer 109 into the spacer pattern 120. A wet etching process may be performed to cause the second trench 113 to dimensionally enlarge in the first, second, and third directions X, Y, and Z. The second trench 113 may increase in width and depth. The wet etching process may use an etchant having no etch selectivity with respect to one or more of the first dielectric layer 107, the second dielectric layer 110, the second interlayer dielectric layer 130, the preliminary electrode layer 108, and the preliminary spacer layer 109. The wet etching process may be performed such that the first dielectric layer 107, the second dielectric layer 110, the second interlayer dielectric layer 130, the preliminary electrode layer 108, and the preliminary spacer layer 109 may become reduced in thickness in the third direction Z. For example, the thickness of the first dielectric layer 107 may be reduced by about 10 nm to about 20 nm. The second trench 113 may have a first depth D1 greater than a first thickness $T_1$ of the bottom electrode BE. For example, the first depth D1 may be about 120 nm to about 140 nm. The bottom electrode BE may be formed to have the first thickness $T_1$ of about 20 nm to about 60 nm.

Referring to FIGS. 6, 13A, 13B, 14A, and 14B, the phase change pattern 140 may be formed in the second trench 113 (S30). The phase change pattern 140 may be formed by, for example, a damascene process.

Figure 13A:
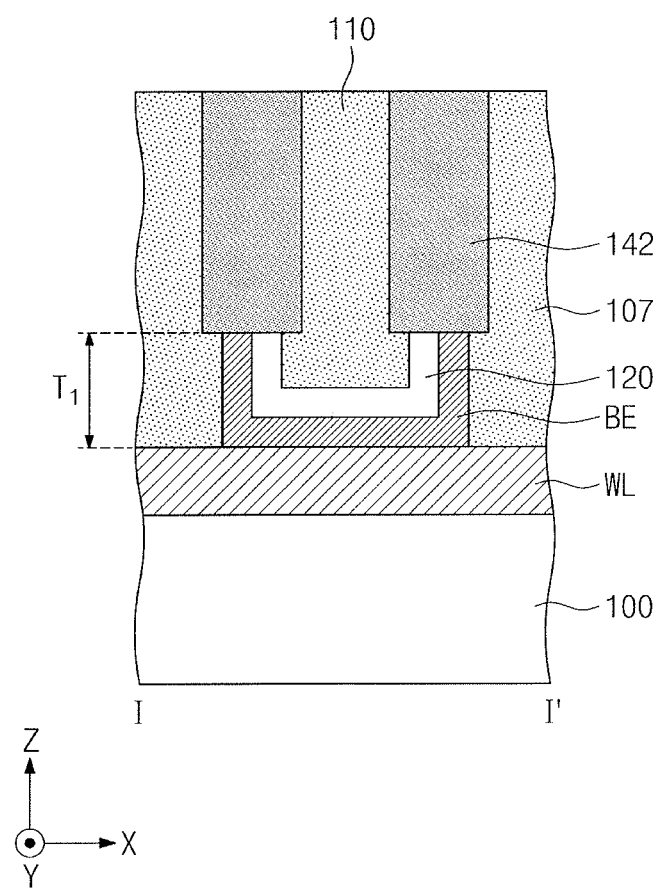
Figure 13B:
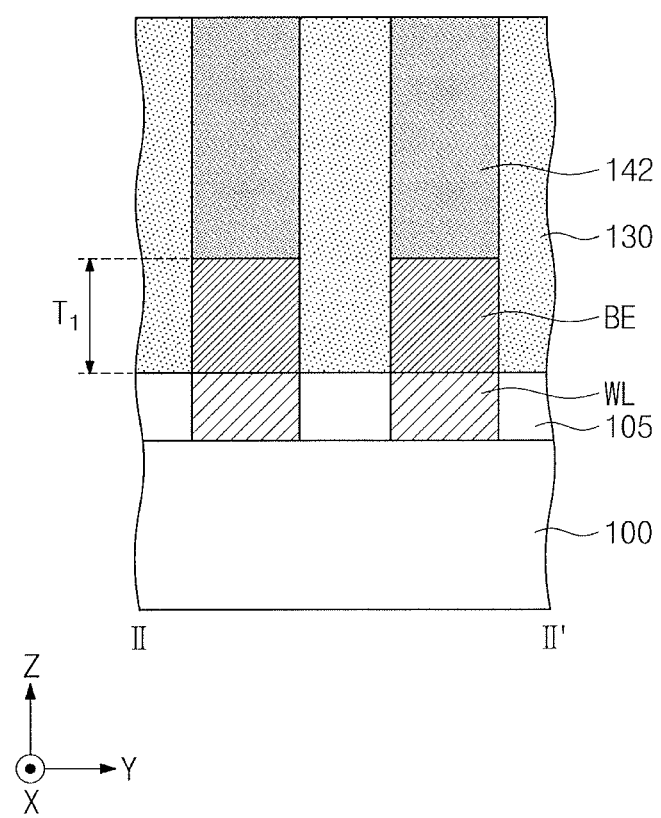

Referring to FIGS. 13A and 13B, a preliminary phase change pattern 142 may be formed in the second trench 113. The preliminary phase change pattern 142 may include a compound in which one or more of Te and Se as chalcogen elements are combined with one or more of Ge, Sb, Bi, Pb, Sn, Ag, As, S, Si, In, Ti, Ga, P, O, and C. The preliminary phase change pattern 142 may be formed by a thin-layer deposition process to form a metal layer and a chemical mechanical polishing process. The chemical mechanical polishing process may reduce the thickness of the first dielectric layer 107. For example, the thickness of the first dielectric layer 107 may be reduced by about 20 nm.

Figure 14A:
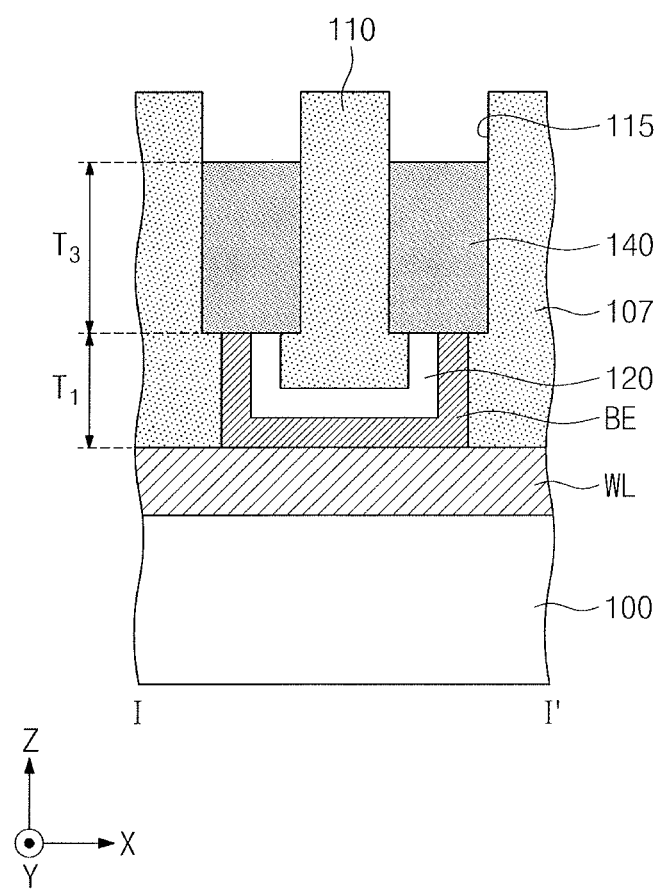
Figure 14B:
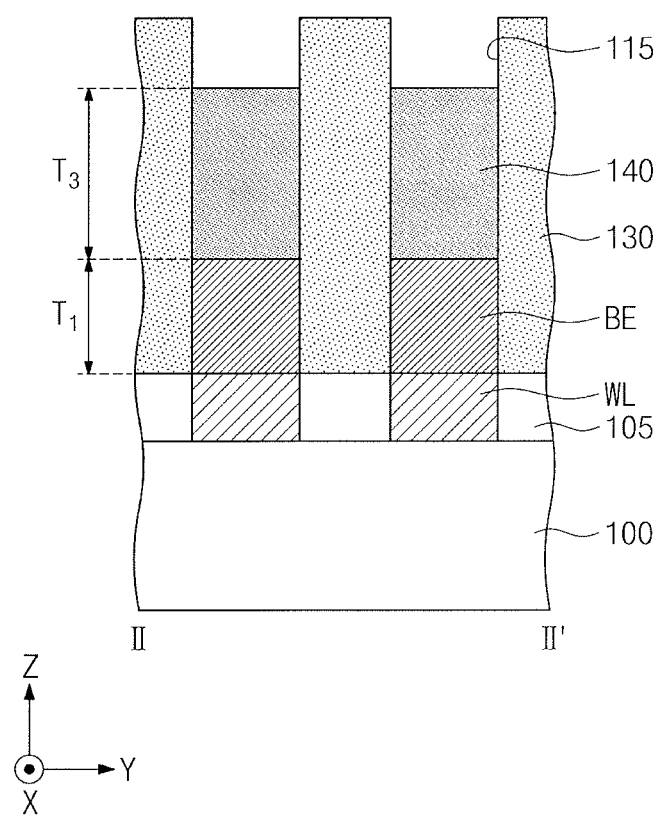

Referring to FIGS. 14A and 14B, an upper portion of the preliminary phase change pattern 142 may be removed to form the phase change pattern 140. A third trench 115 may be formed on the phase change pattern 140. The phase change pattern 140 may be formed to have a third thickness $T_3$ of about 40 nm to about 90 nm.

Figure 15A:
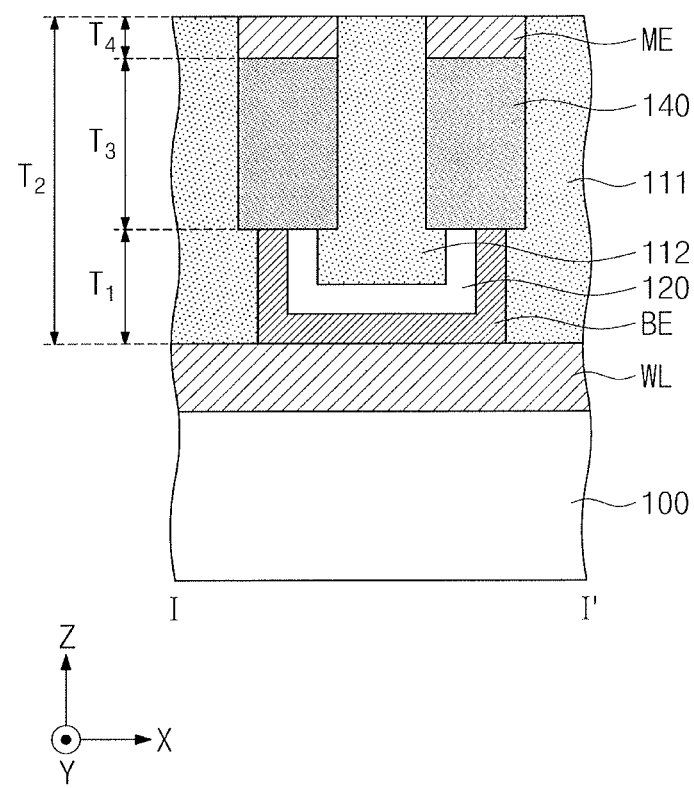
Figure 15B:
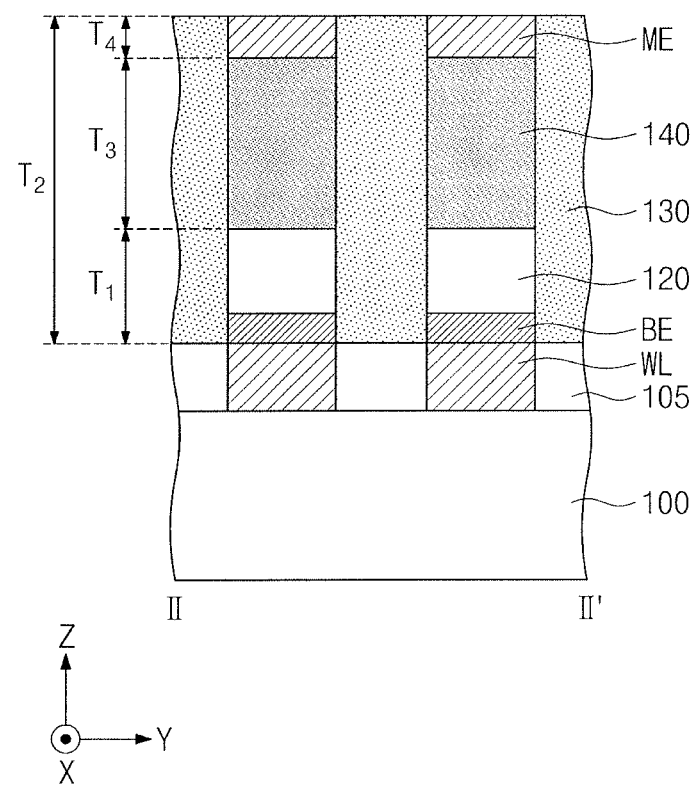

Referring to FIGS. 6, 15A, and 15B, the middle electrode ME may be formed in the third trench 115. The middle electrode ME may be formed by, for example, a damascene process. For example, the middle electrode ME may be formed by a deposition process to form a metal layer and a chemical mechanical polishing process. The middle electrode ME may be formed to have a fourth thickness $T_4$ equal to or less than about 10 nm. The chemical mechanical polishing process may reduce thicknesses of the first dielectric layer 107, the second dielectric layer 110, and the second interlayer dielectric layer 130. For example, the thicknesses of the first dielectric layer 107 and the second interlayer dielectric layer 130 may be reduced by about 20 nm. From the thin-layer deposition process to form the first dielectric layer 107 until the formation of the middle electrode ME, the thickness of the first dielectric layer 107 may be reduced by about 100 nm or more. The first dielectric layer 107 and the second dielectric layer 110 may be respectively formed into the first dielectric pattern 111 and the second dielectric pattern 112. When a damascene process is performed to form the phase change pattern 140 to have first and second widths $W_1$ and $W_2$ of about 20 nm, the first dielectric pattern 111 and the second interlayer dielectric layer 130 may each be formed to have a second thickness $T_2$ equal to or less than about 100 nm.

Figure 16A:
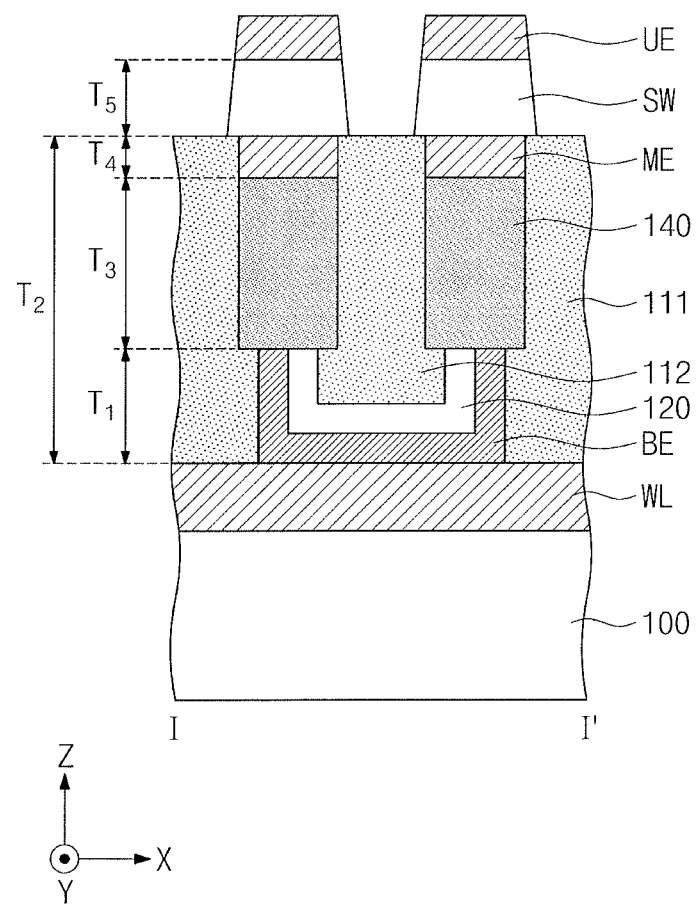
Figure 16B:
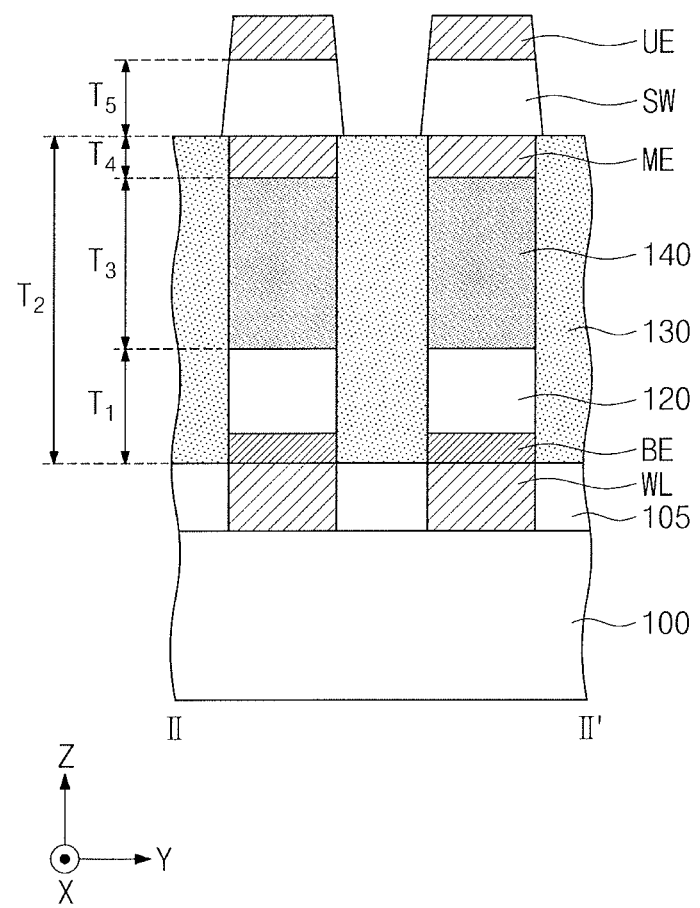

Referring to FIGS. 6, 16A, and 16B, the switching pattern SW and the top electrode UE may be formed on the middle electrode ME (S40). For example, the switching pattern SW and the top electrode UE may be formed by a thin-layer deposition process, a photolithography process, and a dry etching process. The dry etching process may include a reactive ion etching (RIE) process. The switching pattern SW may be formed to have a fifth thickness $T_5$ of about 10 nm to about 15 nm.

Figure 17A:
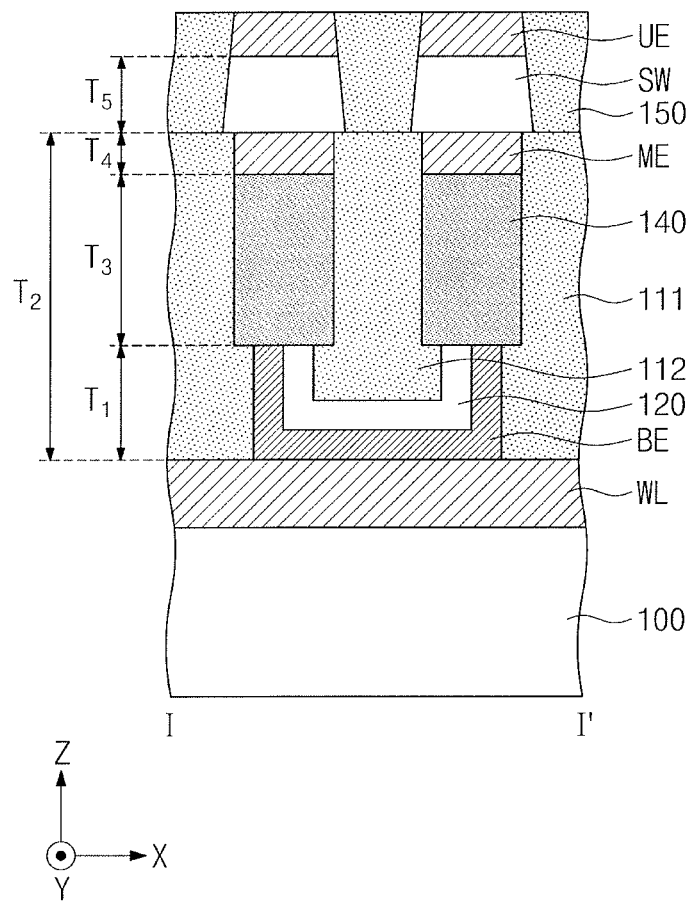
Figure 17B:
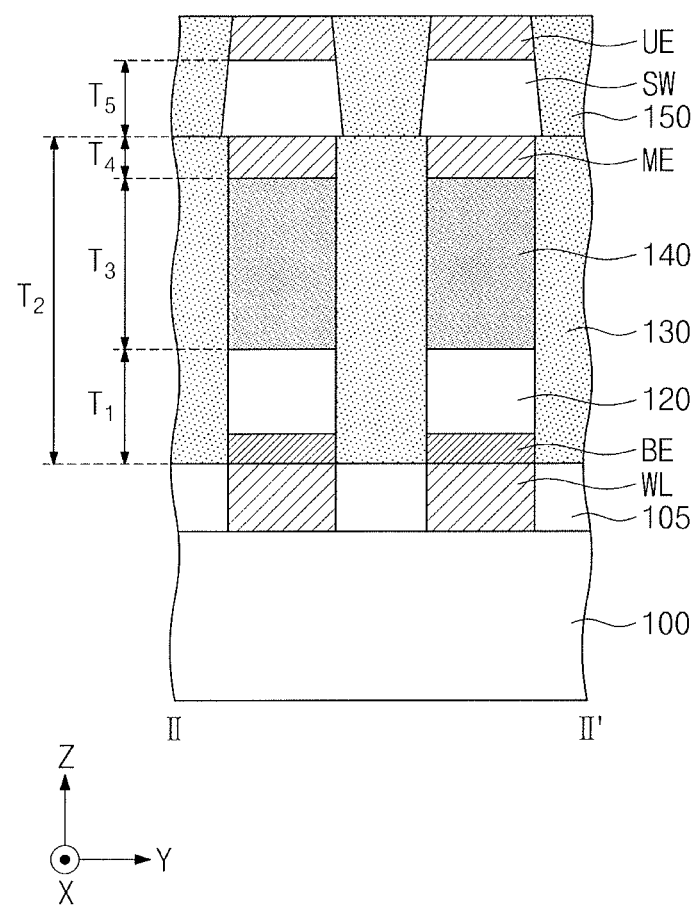

Referring to FIGS. 6, 17A, and 17B, the third interlayer dielectric layer 150 may be formed between a plurality of the switching patterns SW and between a plurality of the top electrodes UE (S50). The third interlayer dielectric layer 150 may be formed by a thin-layer deposition process to form a dielectric layer and a chemical mechanical polishing process. The third interlayer dielectric layer 150 may include silicon nitride or silicon oxide.

Referring to FIGS. 2A, 2B, and 6, the bit line BL may be formed on the top electrode UE and the third interlayer dielectric layer 150 (S60). The bit line BL may be formed by a thin-layer deposition process to form a metal layer, a photolithography process, and an etching process.

By way of summation and review, example embodiments provide a variable resistance memory device with improved reliability. That is, according to embodiments, a phase change pattern may be formed to be thicker than the bottom electrode along a vertical direction to compensate the threshold voltage change of the switching pattern on the phase change pattern. Therefore, the variable resistance memory device may improve in reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A variable resistance memory device, comprising:
a word line extending in a first direction;
a bit line on the word line and extending in a second direction intersecting the first direction;
a switching pattern between the bit line and the word line;
a phase change pattern between the switching pattern and the word line; and
a bottom electrode between the phase change pattern and the word line,
wherein the phase change pattern has a bottom area greater than a top area of the bottom electrode, a thickness of the phase change pattern being greater than a thickness of the bottom electrode;
wherein the bottom and top areas are defined in the first and second directions, and the thicknesses are defined in a third direction intersecting the first and second directions,
wherein the switching pattern has a same bottom area as the bottom area of the phase change pattern, and has a thickness of about 10 nm to about 15 nm, and
wherein a threshold voltage of the switching pattern is about 3 V to about 4 V.

2. The variable resistance memory device as claimed in claim 1, wherein the phase change pattern and the bottom electrode have a thickness ratio of about 1.5:1 to about 6:1.

3. The variable resistance memory device as claimed in claim 1, wherein the bottom area of the phase change pattern is at least twice the top area of the bottom electrode.

4. The variable resistance memory device as claimed in claim 1, wherein the thickness of the phase change pattern is about 40 nm to about 90 nm.

5. The variable resistance memory device as claimed in claim 1, wherein the thickness of the bottom electrode is about 20 nm to about 60 nm.

6. The variable resistance memory device as claimed in claim 1, wherein a difference between peaks of set voltage and reset voltage is equal to or greater than about 1.2 V.

7. The variable resistance memory device as claimed in claim 1, further comprising a middle electrode between the switching pattern and the phase change pattern, the middle electrode having a thickness equal to or less than about 10 nm.

8. The variable resistance memory device as claimed in claim 1, further comprising a dielectric pattern outside the phase change pattern and the bottom electrode, the dielectric pattern having a thickness equal to or less than about 100 nm.

9. The variable resistance memory device as claimed in claim 1, wherein:
the phase change pattern is provided in plural, and
the variable resistance memory device further comprises a first connection part that connects the plurality of phase change patterns to each other in the first direction.

10. The variable resistance memory device as claimed in claim 1, wherein the phase change pattern has a set voltage and a reset voltage, the set voltage being 0V to 0.6V, and the reset voltage being 1.2V to 1.8V.

11. A variable resistance memory device, comprising:
a word line extending in a first direction on a substrate;
a bottom electrode on the word line;
a plurality of dielectric patterns on the word line and on opposite sides of the bottom electrode, the plurality of dielectric patterns being arranged in the first direction;
a phase change pattern on the bottom electrode between the dielectric patterns;
a middle electrode on the phase change pattern;
a switching pattern on the middle electrode;
a top electrode on the switching pattern; and
a bit line on the top electrode and extending in a second direction intersecting the first direction,
wherein the phase change pattern is wider in the first and second directions than the bottom electrode, thinner in a third direction than the dielectric patterns, and thicker in the third direction than the bottom electrode,
wherein the third direction intersects the first and second directions,
wherein the switching pattern has a same bottom area as the bottom area of the phase change pattern, and has a thickness of about 10 nm to about 15 nm, and
wherein a threshold voltage of the switching pattern is about 3 V to about 4 V.

12. The variable resistance memory device as claimed in claim 11, wherein:
each of the dielectric patterns has a thickness equal to or less than about 100 nm,
the bottom electrode has a thickness of about 20 nm to about 60 nm, and
the phase change pattern has a thickness of about 40 nm to about 90 nm.

13. The variable resistance memory device as claimed in claim 11, further comprising:
a first interlayer dielectric layer on the substrate outside the word line; and
a second interlayer dielectric layer on the first interlayer dielectric layer and having a same thickness as a thickness of each of the dielectric patterns.

14. The variable resistance memory device as claimed in claim 13, further comprising a third interlayer dielectric layer on the dielectric patterns and the second interlayer dielectric layer, the third interlayer dielectric layer being outside the switching pattern and the top electrode.

15. The variable resistance memory device as claimed in claim 11, further comprising a spacer pattern between the bottom electrode and the dielectric patterns.

16. The variable resistance memory device as claimed in claim 11, wherein the phase change pattern has a set voltage and a reset voltage, the set voltage being 0V to 0.6V, and the reset voltage being 1.2V to 1.8V.

* * * * *